(12) United States Patent
Park et al.

(10) Patent No.: US 8,125,141 B2
(45) Date of Patent: Feb. 28, 2012

(54) ORGANIC LIGHT EMITTING DIODE DISPLAY DEVICE

(75) Inventors: Soon-Ryong Park, Yongin (KR); Hee-Seong Jeong, Yongin (KR); Woo-Suk Jung, Yongin (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 0 days.

(21) Appl. No.: 12/845,353

(22) Filed: Jul. 28, 2010

(65) Prior Publication Data

US 2011/0025199 A1 Feb. 3, 2011

(30) Foreign Application Priority Data

Jul. 28, 2009 (KR) .................. 10-2009-0069060

(51) Int. Cl.
*H01J 1/62* (2006.01)
(52) U.S. Cl. ...................................... 313/504
(58) Field of Classification Search .................. 313/504, 313/506, 112
See application file for complete search history.

(56) References Cited

U.S. PATENT DOCUMENTS

| 6,812,637 | B2 | 11/2004 | Cok et al. |
| 2003/0107314 | A1 | 6/2003 | Urabe et al. |
| 2009/0091238 | A1 * | 4/2009 | Cok et al. ............... 313/498 |
| 2009/0224662 | A1 | 9/2009 | Wu |

FOREIGN PATENT DOCUMENTS

| JP | 2001167874 A | 6/2001 |
| JP | 2001-351777 | 12/2001 |
| JP | 2005-243549 | 9/2005 |
| JP | 2008181730 A | 8/2008 |
| JP | 2008-218366 | 9/2008 |
| KR | 10-0703524 | 3/2007 |
| KR | 10-2007-0056469 | 6/2007 |
| KR | 10-2007-0121091 | 12/2007 |
| KR | 10-2008-0090627 | 10/2008 |

\* cited by examiner

*Primary Examiner* — Vip Patel
(74) *Attorney, Agent, or Firm* — Robert E. Bushnell, Esq.

(57) ABSTRACT

An organic light emitting diode (OLED) display device includes a first substrate main body divided into a plurality of pixel areas, and a non-pixel area respectively disposed between each of the plurality of pixel areas; a plurality of organic light emitting elements formed in each of the plurality of pixel areas; a second substrate main body disposed to face to the plurality of organic light emitting elements with a vacuumed space therebetween; and a selective light absorbing layer formed on a major surface of the second substrate main body and the selective light absorbing layer facing toward the non-pixel area, and the selective light absorbing layer selectively absorbing light of a color that corresponds to a major color component among color components of external incident light reflected at one of the plurality of organic light emitting elements neighboring the non-pixel area.

36 Claims, 5 Drawing Sheets

ORGANIC LIGHT EMITTING DIODE DISPLAY DEVICE

CLAIM OF PRIORITY

This application makes reference to, incorporates the same herein, and claims all benefits accruing under 35 U.S.C. §119 from an application earlier filed in the Korean Intellectual Property Office on 28 Jul. 2009 and there duly assigned Serial No. 10-2009-0069060.

BACKGROUND OF THE INVENTION

1. Field of the Invention

The present invention relates to an organic light emitting diode (OLED) display device. More particularly, the present invention relates to an OLED display device of which a display characteristic is improved by efficiently suppressing reflection of external light.

2. Description of the Related Art

An organic light emitting diode (OLED) display device is a self emissive display device that displays images by using organic light emitting diodes, and has a relatively smaller thickness and lighter weight compared to a LCD device, because the OLED display device differs from a liquid crystal display (LCD) device in that the OLED display device does not require a separate light source while the LCD device requires a separate light source. Furthermore, because the organic light emitting diode display device involves high quality characteristics such as low power consumption, high luminance, and short response time, the OLED device is spotlighted as a next generation display device for portable electronic appliances.

Usually, at least one of the hole injection electrodes or the electron injection electrodes of the OLED display device, and other various metal wires thereof, may reflect light that is incident thereupon from the exterior of the OLED device. Thus, when the OLED display device is used in a bright environment, the black color expression and the contrast of the OLED display device become poor due to the reflection of external light incident from the exterior of the OLED display device.

In order to solve the problems, a polarizing plate and a phase delay plate are disposed for suppressing reflection of the external light. A contemporary method that suppresses reflection of external light through the polarizing plate and the phase delay plate however has a problem where a large amount of light generated from an organic emission layer may also be lost when the light generated from an organic emission layer is emitted to the exterior of the OLED display device by the polarizing plate and the phase delay plate.

The above information disclosed in this Background section is only for enhancement of understanding of the background of the invention and therefore it may contain information that does not form the prior art that is already known in this country to a person of ordinary skill in the art.

SUMMARY OF THE INVENTION

It is therefore an aspect of the present invention to provide an improved organic light emitting diode (OLED) display device to improve visibility by suppressing reflection of external light and to minimize loss of light emitted by the organic light emitting element.

An organic light emitting diode (OLED) display device according to an exemplary embodiment of the present invention includes a first substrate main body divided into a plurality of pixel areas each of which is disposed spaced apart from each other, and a non-pixel area disposed between each of the plurality of pixel areas, a plurality of organic light emitting elements formed in each of the plurality of pixel areas, a second substrate main body disposed to face to the plurality of the organic light emitting elements with a space disposed between the second substrate main body and the plurality of organic light emitting elements, and the space being sealed in a vacuum, and a selective light absorbing layer formed on a major surface of the second substrate main body and the selective light absorbing layer corresponding to and facing toward the non-pixel area. The selective light absorbing layer selectively absorbs light of a color that corresponds to a major color component among color components of external incident light reflected by one of the organic light emitting elements neighboring the non-pixel area.

An OLED display device according to another exemplary embodiment of the present invention includes a first substrate main body divided into a plurality of pixel areas, each of which is disposed spaced apart from each other, and a non-pixel area disposed between each of the plurality of pixel areas, a plurality of organic light emitting elements formed in each of the plurality of pixel areas, a second substrate main body disposed to face to the plurality of organic light emitting elements with a space between the second substrate main body and the plurality of organic light emitting elements, and space being sealed with the first and second substrate main bodies in a vacuum-tight manner, and a selective light absorbing layer formed on one a major surface of the second substrate main body, the selective light absorbing layer facing toward the non-pixel area. A mixture of a color of external incident light reflected at one of the plurality of organic light emitting elements neighboring the non-pixel area and a color of the selective light absorbing layer facing toward the non-pixel area has brightness that is lower than brightness of each of the color of external incident light reflected at the one of the plurality of organic light emitting elements neighboring the non-pixel area and the color of the selective light absorbing layer facing toward the non-pixel area.

The color of the external incident light reflected at the one of the plurality of organic light emitting elements and the color of the selective light absorbing layer arranged to face to the non-pixel neighboring the one of the plurality of organic light emitting elements are in a complementary relationship.

The plurality of organic light emitting elements may respectively emit light of at least one of two or more colors.

The selective light absorbing layer may be divided into a plurality of light absorbing areas that respectively absorb light of at least one of two or more colors.

One of the plurality of light absorbing areas absorbing light of a color may be arranged to surround an organic light emitting element that reflects the light of the color the most.

A color of light emitted from each of the plurality of organic light emitting elements may include three primary colors, namely red-based, green-based, and blue-based colors.

An organic light emitting element emitting light of a red-based color may reflect relatively light of a green-based color the most, an organic light emitting element emitting light of a green-based color may reflect relatively light of a blue-based color the most, and an organic light emitting element emitting light of a blue-based color may reflect relatively light of a red-based color the most.

The plurality of light absorbing areas may include a first light absorbing area absorbing light of a green-based color, a second light absorbing area absorbing light of a blue-based color, and a third light absorbing area absorbing light of a red-based color.

The first light absorbing area may be arranged to surround the organic light emitting element that emits light of a red-based color.

The selective light absorbing layer of the first light absorbing area may be a color filter having a magenta-based color.

The second light absorbing area may be arranged to surround the organic light emitting element that emits light of a green-based color.

The selective light absorbing layer of the second light absorbing area may be a color filter having a yellow-based color.

The third light absorbing area may be arranged to surround the organic light emitting element that emits light of a blue-based color.

The selective light absorbing layer of the third light absorbing area may be a color filter having a cyan-based color.

The OLED display device may further include a color purity enhancing layer formed at one side of the second substrate main body, facing toward the pixel area.

The color purity enhancing layer may be a color filter having the same color as that of light emitted from the organic light emitting element facing toward the color purity enhancing layer.

The selective light absorbing layer may be formed of a first color layer and a second color layer stacked with different colors, and the selective light absorbing layer may have a color where the color of the first color layer and the color of the second color layer are mixed.

The color purity enhancing layer may be formed simultaneously with the first color layer of the selective light absorbing layer.

According to the exemplary embodiment of the present invention, visibility of the OLED display device can be improved by effectively suppressing reflection of external light, and by minimizing the light loss emitted outside from the organic light emitting element.

Further, the OLED display device can have an improved light viewing angle.

BRIEF DESCRIPTION OF THE DRAWINGS

A more complete appreciation of the invention, and many of the attendant advantage thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Furthermore, with exemplary embodiments of the present invention, detailed description is given for the constituent elements in the first exemplary embodiment with reference to the relevant drawings by using the same reference numerals for the same constituent elements, while only different constituent elements from those related to the first exemplary embodiment are described in other exemplary embodiments.

Parts that are irrelevant to the description are omitted in order to clearly describe the present invention, and like reference numerals designate like elements throughout the specification.

Furthermore, as the size and thickness of the respective structural components shown in the drawings are arbitrarily illustrated for explanatory convenience, the present invention is not necessarily limited to as illustrated.

In the drawings, the thickness of layers, films, panels, regions, etc., are exaggerated for clarity and explanatory convenience. It will be understood that when an element such as a layer, film, region, or substrate is referred to as being "on" another element, it can be directly on the other element or intervening elements may also be present.

Hereinafter, a first exemplary embodiment of the present invention will be described with reference to FIG. 1.

Figure 1:
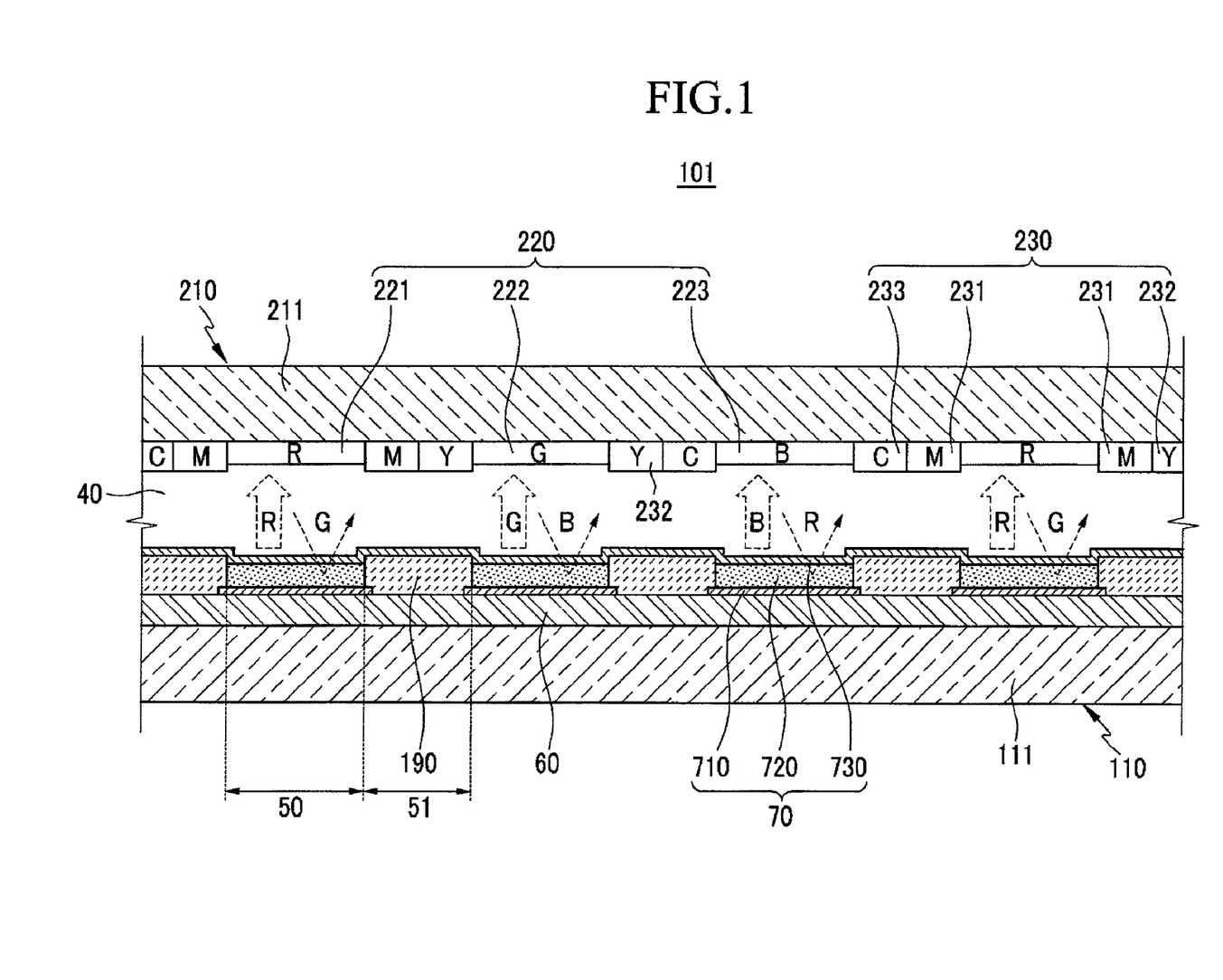
FIG. 1 is a cross-sectional view of an organic light emitting diode (OLED) display device according to a first exemplary embodiment of the present invention.

As shown in FIG. 1, an organic light emitting diode (OLED) display device 101 according to the first exemplary embodiment of the present invention includes a display substrate 110 and an encapsulation substrate 210 sealed with display substrate 110 in a vacuum-tight manner.

Display substrate 110 includes a first substrate main body 111, a driving circuit (DC) 60, and an organic light emitting element 70.

The first substrate main body 111 may be formed of an insulation substrate made of glass, quartz, ceramic, or plastic. However, the first exemplary embodiment of the present invention is not limited thereto, and the first substrate main body 111 may be formed of a metallic substrate made of stainless steel.

The first substrate main body 111 is divided into a plurality of pixel areas 50 disposed spaced apart from each other, and non-pixel areas 51 respectively disposed between each of the plurality of pixel areas.

Driving circuit DC 60 may be formed on the first substrate main body 111. Driving circuit DC 60 includes thin film transistors 10 and 20 (shown in FIGS. 2 and 3), and driving circuit DC 60 drives organic light emitting element 70.

Organic light emitting element 70 is formed at each of the plurality of pixel areas 50, and emits light according to a driving signal transmitted from driving circuit DC 60. Organic light emitting element 70 includes a pixel electrode 710 that may function as an anode, a common electrode 730 that may function as a cathode, and an organic emission layer 720 disposed between pixel electrode 710 and common electrode 730. Pixel electrode 710, organic emission layer 720, and common electrode 730 are sequentially stacked on each pixel area of the first substrate main body 111.

A plurality of organic light emitting elements 70 formed at each of the plurality of pixel areas 50 respectively emit one of two or more colors. In the first exemplary embodiment of the present invention, the plurality of organic light emitting elements 70 respectively emit one of three primary colors of red, green, and blue. However, the first exemplary embodiment of the present invention is not limited thereto.

In addition, display substrate 110 further includes a pixel definition layer 190. Pixel definition layer 190 has an opening through which pixel electrode 710 of organic light emitting element 70 is exposed. That is, pixel definition layer 190 corresponds to the non-pixel area 51 of the first substrate main body 111, and the opening of pixel definition layer 190 corresponds to the pixel area of the first substrate main body 111.

Figure 2:
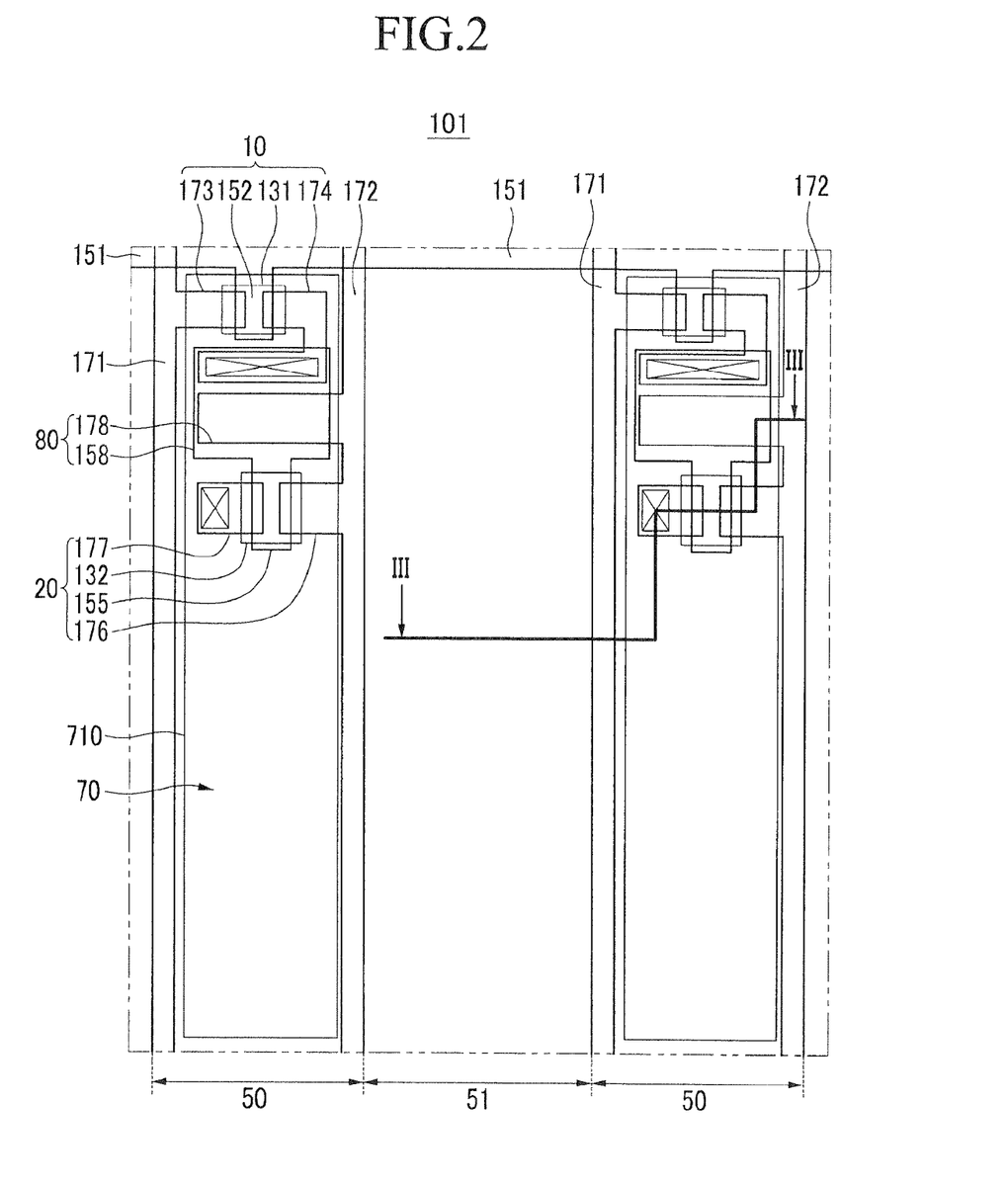
FIG. 2 is an enlarged layout view of an internal structure of the OLED display device of FIG. 1.
Figure 3:
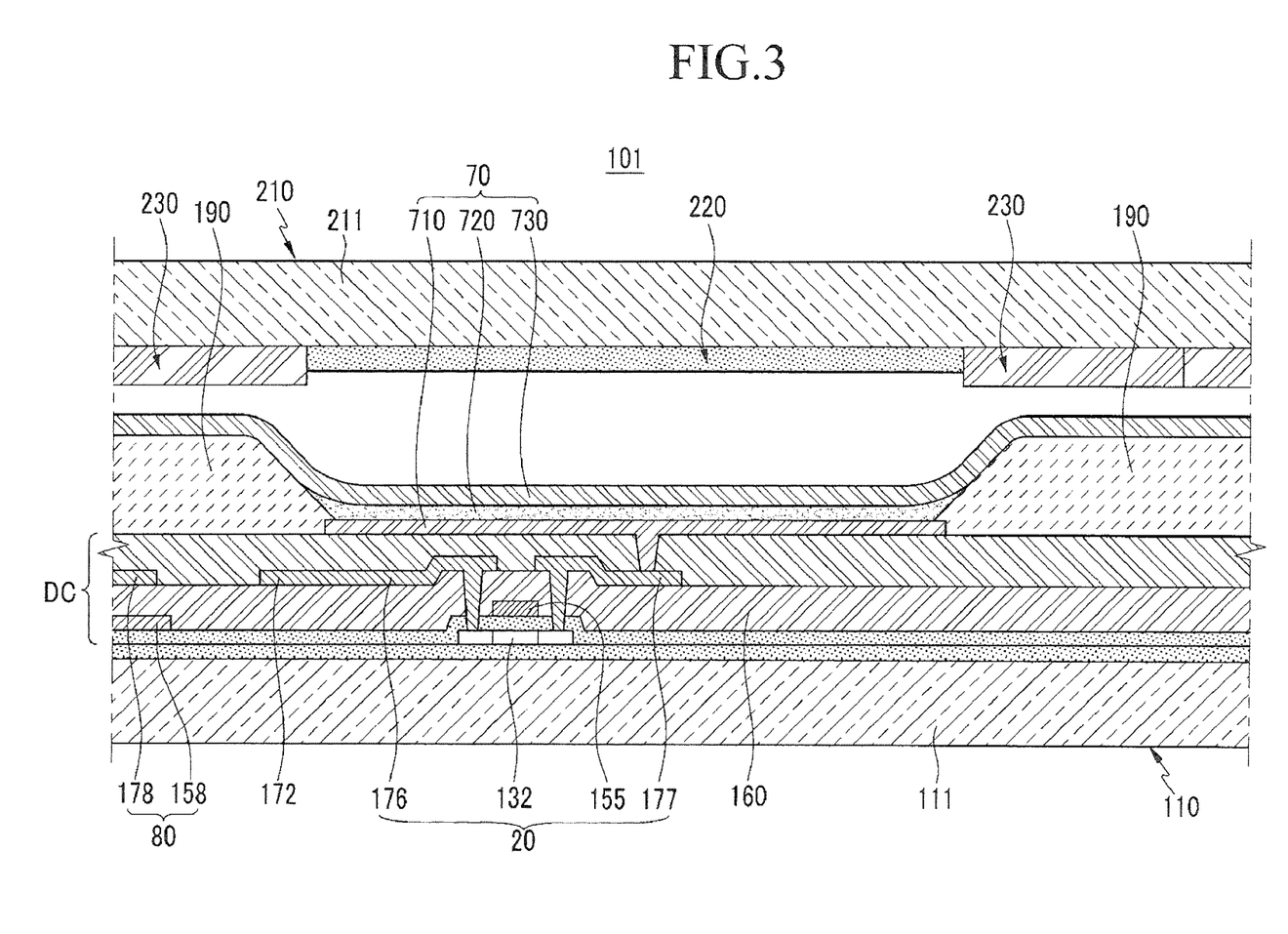
FIG. 3 is a cross-sectional view of FIG. 2, taken along cross-sectional line III-III of FIG. 2.

Structures of organic light emitting element 70 and driving circuit DC 60 are shown in FIG. 2 and FIG. 3, but the first exemplary embodiment of the present invention is not limited to the structures shown in FIG. 2 and FIG. 3. OLED 70 and driving circuit DC 60 may be variously modified within a range that can be easily realized by a person skilled in the art.

In addition, in the first exemplary embodiment of the present invention, organic light emitting element 70 displays an image by emitting light toward encapsulation substrate 210. That is, OLED display device 101 has a top light emitting structure.

Encapsulation substrate 210 includes a second substrate main body 211 and a selective light absorbing layer 230. In addition, encapsulation substrate 210 further includes a color purity enhancing layer 220.

The second substrate main body 211 may be formed of an insulation substrate made of glass, quartz, ceramic, or plastic. The second substrate main body 211 is disposed in correspondence to organic light emitting element 70 with a gap 40 between the second substrate main body 211 and organic light emitting element 70, and the gap is sealed with the first substrate main body 111 through a sealant (not shown) in a vacuum-tight manner. The sealant (not shown) is disposed between the two substrates 110 and 210 along edges of display substrate 110 and encapsulation substrate 210.

The selective light absorbing layer 230 is formed on one major surface of the second substrate main body 211, and the selective light absorbing layer 30 faces toward and corresponds to the non-pixel area 51 of the first substrate main body 111. That is, the selective light absorbing layer 230 faces to pixel definition layer 190.

The selective light absorbing layer 230 selectively absorbs light of a color component having a large amount among color components of external light incident from the outside and reflected at organic light emitting element 70. In other words, the selective light absorbing layer 230 selectively absorbs light of a color component which is the major color component among all the color components of light which is incident from the exterior of the OLED display device and is reflected by organic light emitting element 70. In addition, the selective light absorbing layer 230 is divided into a plurality of light absorbing regions 231, 232, and 233 that respectively absorb light of a color among two or more colors. In the first exemplary embodiment of the present invention, the selective light absorbing layer 230 is divided into a first light absorbing region 231, a second light absorbing region 232, and a third light absorbing region 233. The first exemplary embodiment of the present invention is however not limited thereto. The selective light absorbing layer 230 may be divided into two or four or more light absorbing regions.

In FIG. 1, the arrows of dotted lines represent the light proceeding direction, and reference numerals R, G, B, M, Y, and C respectively represent initials of respective colors. That is, R denotes red, G denotes green, B denotes blue, M denotes magenta, Y denotes yellow, and C denotes cyan.

Light incident through encapsulation substrate 210 from the exterior of the OLED display device 101 is reflected at common electrode 730 or pixel electrode 710 of organic light emitting element 70. OLED display device 101 according to the first exemplary embodiment of the present invention is a top light emission type, and therefore most of the light incident from the exterior is reflected at pixel electrode 710 that is made of a reflective material. In this case, since the reflected external light passes through an organic emission layer 720, a relatively large amount of light of a specific wavelength band is reflected according to a color of light emitted from the corresponding organic emission layer 720. In other words, the major color component of the external incident light reflected by the organic emission layer 720 is determined by the color of the light emitted from the organic emission layer 720.

In further detail, an organic light emitting element 70 emitting light of a red-based color relatively reflects light of a green-based color the most. In further detail, an organic light emitting element 70 emitting light of a green-based color relatively reflects light of a blue-based color the most. In further detail, an organic light emitting element 70 emitting light of a blue-based color relatively reflects light of a red-based color the most.

Therefore, one of light absorption areas 231, 232, and 233 absorbing light of a color is arranged to surround an organic light emitting element 70 that relatively reflects light of the color the most.

For example, the first light absorbing region 231 absorbs light of a green-based color, and is arranged to surround an organic light emitting element 70 that emits light of a red-based color and reflects light of the green-based color the most. In this case, a selective light absorbing region 231 of the first light absorbing region 231 is formed of a color filter having a magenta-based color.

In addition, the second light absorbing region 232 absorbs light of a blue-based color, and is arranged to surround an organic light emitting element 70 that emits light of a green-based color and reflects light of blue-based color the most. In this case, a selective light absorbing layer 230 of the second light absorbing region 232 is formed of a color filter having a yellow-based color.

The third light absorbing region 233 absorbs light of a red-based color, and is arranged to surround an organic light emitting element 70 that emits light of a blue-based color and reflects light of red-based color the most. In this case, a selective light absorbing layer 230 of the third light absorbing region 233 is formed of a color filter having a cyan-based color.

Alternatively, the selective light absorbing layer 230 may be formed of a color filter of various types that have been known to a person in the art.

With the above configuration, OLED display device 101 according to the first exemplary embodiment of the present invention can effectively suppress reflection of external light. That is, the selective light absorbing layer 230 selectively absorbs external incident light of a specific wavelength band that is reflected from organic light emitting element 70 so that reflection of external light can be effectively suppressed without loosing light emitted from organic light emitting element 70.

In addition, in the first exemplary embodiment of the present invention, the colors of the respective light absorbing layers 231, 232, and 233 of the selective light absorbing layer 230 are not limited to the above description. When a color of external light incident from the exterior of the OLED display device and reflected at an organic light emitting element 70 and a color of a selective light absorbing layer 230 that is arranged to surround the corresponding organic light emitting element 70 are mixed, the selective light absorbing layer may have various colors within a range in lower brightness than that of the original colors. When a color of external light incident from the exterior of the OLED display device and reflected at an organic light emitting element 70 and a color of a selective light absorbing layer 230 that is arranged to surround the corresponding organic light emitting element 70 are mixed, the mixture has a color within a range in lower brightness compared to that of each of the two original colors, i.e, the color of external light incident from the exterior of the OLED display device and reflected at an organic light emitting element 70 and the color of a selective light absorbing layer 230 that is arranged to surround the corresponding organic light emitting element 70.

In particular, reflection of external light can be most effectively suppressed when a color of external light reflected at one organic light emitting element 70 and a color of the selective light absorbing layer 230 arranged to surround the corresponding organic light emitting element 70 are in a complementary relationship. Two colors are complementary to each other when a mixture of the two colors may produce a neutral color, i.e., grey, white, or black when the two colors are mixed in the proper proportion.

Color purity enhancing layer 220 is formed on one major surface of the second substrate main body 211, facing toward the pixel area 50 of the first substrate main body 111. That is, color purity enhancing layer 220 faces to the opening of pixel definition layer 190 and faces to organic emission layer 720 of organic light emitting element 70. Color purity enhancing layer 220 is formed of a color filter having a color that is the same as a color of light emitted from the facing organic light emitting element 70.

In further detail, color purity enhancing layer 220 includes a first color purity enhancing layer 221 facing toward organic light emitting element 70 emitting light of the red-based color, a second color purity enhancing layer 222 facing toward organic light emitting element 70 emitting light of the green-based color, and a third color purity enhancing layer 223 facing toward organic light emitting element 70 emitting light of the blue-based color. In addition, the first color purity enhancing layer 221 is formed of a red color filter, the second color purity enhancing layer 222 is formed of a green color filter, and the third color purity enhancing layer 223 is formed of a blue color filter.

Color purity enhancing layer 220 prevents a light defect due to mixture of external incident light with light emitted from organic light emitting element 70. In addition, color purity enhancing layer 220 absorbs unnecessary light except light of colors of purity enhancing layer 220 so that reflection of the external light can be suppressed.

As described, OLED display device 101 according to the first exemplary embodiment of the present invention can improve visibility by effectively suppressing reflection of external light. Further, loss of light emitted from organic light emitting element 70 is minimized so that power consumption of OLED display device 101 can be reduced and life-span thereof can be increased.

In addition, compared to a contemporary OLED display device where a black light blocking layer is disposed on one major surface of the second substrate main body 211 instead of the selective light absorbing layer 230 to suppress reflection of external light, OLED display device 101 according to the first exemplary embodiment of the present invention has an improved light viewing angle. The contemporary light blocking layer blocks all the light, but the selective light absorbing layer 230 selectively absorbs light so that the viewing angle can be improved.

Hereinafter, an internal structure of OLED display device 101 will be described in detail with reference to FIG. 2 and FIG. 3. FIG. 2 is a layout view of a pixel structure, focusing on display substrate 110, and FIG. 3 is a cross-sectional view of display substrate 110 and encapsulation substrate 210 of FIG. 2, taken along the line III-III.

FIG. 2 and FIG. 3 illustrate the active matrix (AM) organic light emitting diode display device 101 with a 2Tr-1Cap structure where two thin film transistors (TFT) 10 and 20 and a capacitor 80 are formed at each pixel, but the first exemplary embodiment of the present invention is not limited thereto. Accordingly, OLED display device 101 may have three or more thin film transistors and two or more capacitors per each pixel, and a separate wire with various different structures. Here, the pixel is a minimal unit for displaying an image, and OLED display device 101 displays images through a plurality of pixels.

As shown in FIG. 2 and FIG. 3, display substrate 110 includes a switching thin film transistor 10, a driving thin film transistor 20, a capacitor 80, and an organic light emitting diode (OLED) 70, which are formed at each pixel. The structure constructed by switching thin film transistor 10, driving thin film transistor 20, and capacitor 80 is called a driving circuit DC 60. Display substrate 110 further includes gate lines 151 arranged in a direction, data lines 171 crossing gate lines 151 in an insulated manner, and a common power line 172.

A pixel may be defined by taking gate lines 151, data line 171, and common power line 172 as a boundary, but is not limited thereto.

OLED 70 includes a pixel electrode 710, an organic emission layer 720 formed on pixel electrode 710, and a common electrode 730 formed on organic emission layer 720. Here, pixel electrode 710 may be a positive (+) electrode which is a hole injection electrode, and common electrode 730 may be a negative (−) electrode which is an electron injection electrode. The first exemplary embodiment of the present invention is however not limited thereto. That is, pixel electrode 710 may be a negative electrode and common electrode 730 may be a positive electrode according to a driving method of OLED display device 101. Holes and electrons are injected to organic emission layer 720 respectively from pixel electrode 710 and common electrode 730. When excitons being combinations of the injected holes and electrons fall from an excited state to a ground state, light is emitted.

The pixel area 50 that may be defined as an opening of pixel definition layer 190 indicates an area where organic emission layer 720 substantially emits light.

In addition, in OLED display device 101 according to the first exemplary embodiment of the present invention, OLED 70 emits light toward encapsulation substrate 210. In order for OLED 70 to emit light toward encapsulation substrate 210, pixel electrode 710 is formed as a reflective electrode, and common electrode 730 is formed as a transparent or semi-transparent electrode.

Capacitor 80 includes a pair of capacitor electrode plates 158 and 178, interposing an interlayer insulating layer 160 therebetween. Here, interlayer insulating layer 160 functions as a dielectric material. The capacitance is determined depending upon electric charges charged at the first capacitor 80 and the voltages applied to the two capacitor electrode plates 158 and 178.

Switching thin film transistor 10 includes a switching semiconductor layer 131, a switching gate electrode 152, a switching source electrode 173, and a switching drain electrode 174. Driving thin film transistor 20 includes a driving semiconductor layer 132, a driving gate electrode 155, a driving source electrode 176, and a driving drain electrode 177.

Switching thin film transistor 10 is used as a switch for selecting a pixel to emit light. Switching gate electrode 152 is electrically connected to gate line 151. Switching source electrode 173 is electrically connected to data line 171. Switching drain electrode 174 is separated from switching source electrode 173 and is electrically connected to one of capacitor electrode plates 158 and 178, for example, capacitor electrode plate 158.

Driving thin film transistor 20 applies a driving voltage to pixel electrode 710 to excite an organic emission layer 720 of an OLED 70 in the selected pixel. Driving gate electrode 155 is electrically connected to capacitor electrode plate 158 electrically connected with switching drain electrode 174. Driving source electrode 176 and the other capacitor electrode plate 178 are respectively electrically connected to common power line 172. Driving drain electrode 177 is electrically connected to pixel electrode 710 of OLED 70 through a contact hole.

With such a structure, switching thin film transistor 10 is operated by the gate voltage applied to gate line 151, and transmits the data voltage applied to data line 171 to driving thin film transistor 20. The voltage with a value corresponding to a difference between the common voltage applied to driving thin film transistor 20 from common power line 172 and the data voltage transmitted from switching thin film transistor 11 is stored at capacitor 80, and the current corresponding to the voltage stored at capacitor 80 flows to OLED 70 through driving thin film transistor 20 to thereby excite OLED 70.

As shown in FIG. 3, encapsulation substrate 210 is disposed on OLED 70 to protect OLED 70.

Hereinafter, a second exemplary embodiment of the present invention will be described with reference to FIG. 4.

Figure 4:
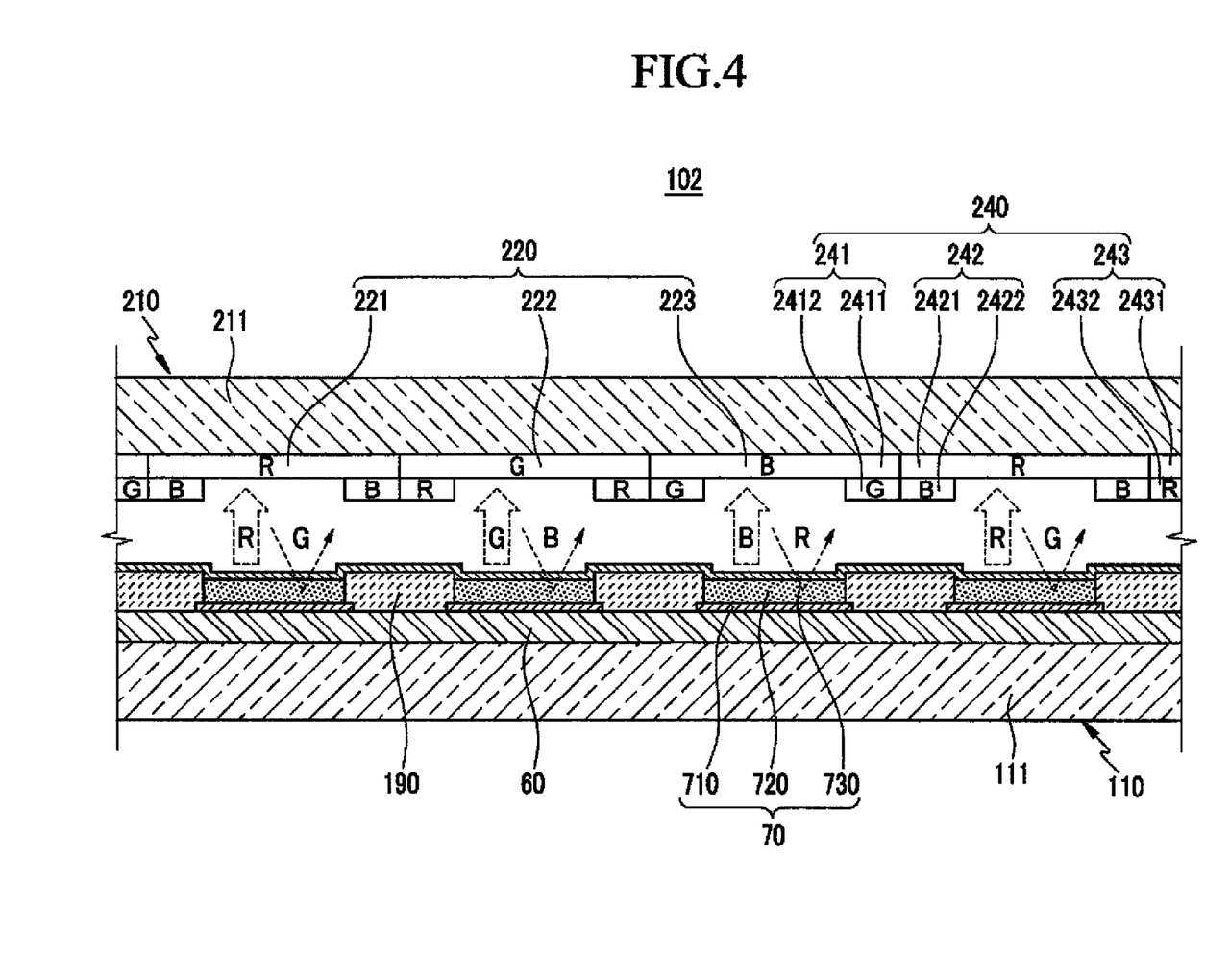
FIG. 4 is a cross-sectional view of an OLED display device according to a second exemplary embodiment of the present invention.

As shown in FIG. 4, an OLED display device 102 according to the second exemplary embodiment of the present invention includes a selective light absorbing layer 240 formed in a multi-layer structure. The selective light absorbing layer 240 is formed of a stack of first color layers 2411, 2421, and 2431 and second color layers 2412, 2422, and 2432, each having a different color. Thus, the selective light absorbing layer 240 has a mixed color of colors of the first color layers 2411, 2421, and 2431 and colors of second color layers 2412, 2422, and 2432.

The selective light absorbing layer 240 are divided into a plurality of light absorbing areas 241, 242, and 243, and each of light absorbing layers 241, 242, and 243 has a different mixed color of the colors of the first color layers 2411, 2421, and 2431 and the colors of the second color layers 2412, 2422, and 2432.

In addition, a color purity enhancing layer 220 includes a first color purity enhancing layer 221 facing an OLED 70 emitting light of a red-based color, a second color purity enhancing layer 222 facing an OLED 70 emitting light of green-based color, and a third color purity enhancing layer 223 facing an OLED 70 emitting light of a blue-based color. The first color purity enhancing layer 221 is formed of a red color filter, the second color purity enhancing layer 222 is formed of a green color filter, and the third color purity enhancing layer 223 is formed of a blue color filter.

Each of color purity enhancing layers 221, 222, and 223 is simultaneously formed with the respective first color layers 2411, 2421, and 2431 of the selective light absorbing layer 240.

In detail, for example, a color purity enhancing layer 221 formed of a color filter having a red-based color is disposed facing toward OLED 70 emitting light of the red-based color from the top. In addition, the selective light absorbing layer 240 of the first light absorbing area 242 that surrounds the corresponding OLED 70 has a structure in which a first color layer 2421 simultaneously formed of the same material of color purity enhancing layer 221 and a second color layer 2422 formed of a color filter having a blue-based color are stacked. Accordingly, the selective light absorbing layer 240 has a magenta-based color from a mixture of a red-based color and a blue-based color.

Selective light absorbing layers 240 of second and third light absorbing areas 243 and 241 are also formed through such a method of forming the selective light absorbing layer 240 of the first light absorbing area 242.

With the above-described configuration, OLED display device 102 according to the second exemplary embodiment of the present invention can more effectively form the selective light absorbing layer 240 and color purity enhancing layer 220. Further, OLED display device 102 can improve visibility and viewing angle by effectively suppressing reflection of external light, and simultaneously productivity can be improved.

Hereinafter, an experimental example and a comparative example will be described with reference to FIG. 5.

In the experimental example, an OLED display device includes a selective light absorbing layer 230 that selectively absorbs light of a specific wavelength band for each pixel area according to the first exemplary embodiment of the present invention. In the comparative example, a contemporary OLED display device includes a black-colored light blocking layer instead of the selective light absorbing layer 230.

In the present experiment, the viewing angle is set to 0 degrees from the front of the OLED display device and 90 degrees from the side of the OLED display device.

Figure 5:
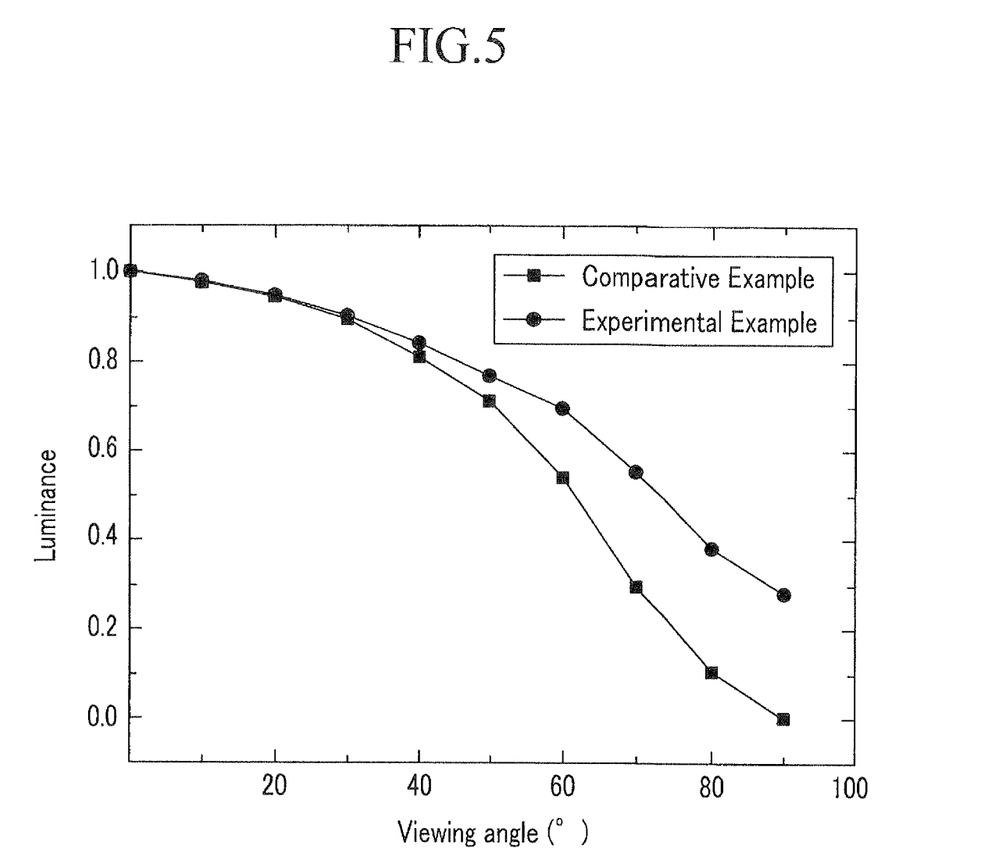
FIG. 5 is a graph illustrating viewing angles of experimental and comparative examples according to the first exemplary embodiment of the present invention.

As shown in FIG. 5, when the viewing angle exceeds 40 degrees, light is completely blocked by the OLED display device having the black-colored light absorbing layer in the case of the comparative example so that visibility is radically deteriorated.

Meanwhile, since the selective light absorbing layer 230 in the experimental example selectively absorbs light of a specific wavelength band from reflected external light rather than absorbing all the light, the visibility is deteriorated slower compared to the comparative example even though the viewing angle exceeds 40 degrees.

As described, through the present experiment, the experimental example according to the first exemplary embodiment of the present invention has improved visibility and light viewing angle compared to the comparative example.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display device, comprising:
    a first substrate main body divided into a plurality of pixel areas each of which is disposed spaced apart from each other, and a non-pixel area disposed between each of the plurality of pixel areas;
    a plurality of organic light emitting elements formed in each of the plurality of pixel areas;
    a second substrate main body disposed spaced apart and facing toward the plurality of organic light emitting elements with a space disposed between the second substrate main body and the plurality of organic light emitting elements, and the space being sealed by the first and second substrate main bodies in a vacuum; and a selective light absorbing layer formed on a major surface of the second substrate main body and the selective light absorbing layer disposed corresponding to and facing toward the non-pixel area, and the selective light absorbing layer selectively absorbing light of a color that corresponds to a major color component among color components of external incident light reflected at one of the plurality of organic light emitting elements neighboring the non-pixel area.

2. The OLED display device of claim 1, wherein the plurality of organic light emitting elements respectively emit light of at least one of two or more colors.

3. The OLED display device of claim 2, wherein the selective light absorbing layer is divided into a plurality of light absorbing areas each respectively absorbing light of at least one of two or more colors.

4. The OLED display device of claim 3, wherein one of the plurality of light absorbing areas absorbing light of a color is arranged to face to one non-pixel area neighboring one of the plurality of organic light emitting elements that reflects light of the color the most.

5. The OLED display device of claim 3, wherein a color of light emitted from each of the plurality of organic light emitting elements includes three primary colors of red-based, green-based, and blue-based colors.

6. The OLED display device of claim 5, wherein an organic light emitting element emitting light of a red-based color relatively reflects light of a green-based color the most, an organic light emitting element emitting light of a green-based color relatively reflects light of a blue-based color the most, and an organic light emitting element emitting light of a blue-based color relatively reflects light of a red-based color the most.

7. The OLED display device of claim 6, wherein the plurality of light absorbing areas comprise a first light absorbing area absorbing light of a green-based color, a second light absorbing area absorbing light of a blue-based color, and a third light absorbing area absorbing light of a red-based color.

8. The OLED display device of claim 7, wherein the first light absorbing area is arranged to face to a non-pixel area surrounding an organic light emitting element that emits light of a red-based color.

9. The OLED display device of claim 8, wherein the selective light absorbing layer of the first light absorbing area is a color filter having a magenta-based color.

10. The OLED display device of claim 7, wherein the second light absorbing area is arranged to face to a non-pixel area surrounding an organic light emitting element that emits light of a green-based color.

11. The OLED display device of claim 10, wherein the selective light absorbing layer of the second light absorbing area is a color filter having a yellow-based color.

12. The OLED display device of claim 7, wherein the third light absorbing area is arranged to face to a non-pixel area surrounding an organic light emitting element that emits light of a blue-based color.

13. The OLED display device of claim 12, wherein the selective light absorbing layer of the third light absorbing area is a color filter having a cyan-based color.

14. The OLED display device of claim 1, further comprising a color purity enhancing layer formed on the major surface of the second substrate main body, the color purity enhancing layer facing toward the pixel area.

15. The OLED display device of claim 14, wherein the color purity enhancing layer is a color filter having the same color of light emitted from the organic light emitting element facing toward the color purity enhancing layer.

16. The OLED display device of claim 15, wherein the selective light absorbing layer is formed of a first color layer and a second color layer stacked with different colors, and the selective light absorbing layer has a color where the color of the first color layer and the color of the second color layer are mixed.

17. The OLED display device of claim 16, wherein the color purity enhancing layer is simultaneously formed with the first color layer of the selective light absorbing layer.

18. An organic light emitting diode (OLED) display device, comprising:

a first substrate main body divided into a plurality of pixel areas, each of which is disposed spaced apart from each other, and a non-pixel area respectively disposed between each of the plurality of pixel areas;

a plurality of organic light emitting elements formed in each of the plurality of pixel areas;

a second substrate main body disposed spaced apart and facing toward the plurality of organic light emitting elements with a space disposed between the second substrate main body and the plurality of organic light emitting elements, and the space being sealed by the first substrate main body and the second substrate main body in a vacuum; and a selective light absorbing layer formed on one major surface of the second substrate main body, and the selective light absorbing layer facing toward the non-pixel area, wherein a mixture of a color of external incident light reflected at one of the plurality of organic light emitting elements neighboring the non-pixel area and a color of the selective light absorbing layer facing toward the non-pixel area has brightness that is lower than brightness of each of the color of external incident light reflected at the one of the plurality of organic light emitting elements neighboring the non-pixel area and the color of the selective light absorbing layer facing toward the non-pixel area.

19. The OLED display device of claim 18, wherein the color of the external incident light reflected at the one of the plurality of organic light emitting elements and the color of the selective light absorbing layer arranged to face to the non-pixel neighboring the one of the plurality of organic light emitting elements are in a complementary relationship.

20. The OLED display device of claim 18, wherein the plurality of organic light emitting elements respectively emit at least one of two or more colors.

21. The OLED display device of claim 20, wherein the selective light absorbing layer is divided into a plurality of light absorbing areas each respectively absorbing light of at least one of two or more colors.

22. The OLED display device of claim 21, wherein one of the plurality of light absorbing areas absorbing light of a color is arranged to face to one non-pixel area neighboring one organic light emitting element that reflects light of the color the most.

23. The OLED display device of claim 21, wherein a color of light emitted from each of the plurality of organic light emitting elements includes three primary colors of red-based, green-based, and blue-based colors.

24. The OLED display device of claim 23, wherein an organic light emitting element emitting light of a red-based color relatively reflects light of a green-based color the most, an organic light emitting element emitting light of a green-based color relatively reflects light of a blue-based color the most, and an organic light emitting element emitting light of a blue-based color relatively reflects light of a red-based color the most.

25. The OLED display device of claim 24, wherein the plurality of light absorbing areas comprise a first light absorbing area absorbing light of a green-based color, a second light absorbing area absorbing light of a blue-based color, and a third light absorbing area absorbing light of a red-based color.

26. The OLED display device of claim 25, wherein the first light absorbing area is arranged to face to a non-pixel area surrounding an organic light emitting element that emits light of a red-based color.

27. The OLED display device of claim 26, wherein the selective light absorbing layer of the first light absorbing area is a color filter having a magenta-based color.

28. The OLED display device of claim 25, wherein the second light absorbing area is arranged to face to a non-pixel area surrounding an organic light emitting element that emits light of a green-based color.

29. The OLED display device of claim 28, wherein the selective light absorbing layer of the second light absorbing area is a color filter having a yellow-based color.

30. The OLED display device of claim 25, wherein the third light absorbing area is arranged to face to a non-pixel area surrounding an organic light emitting element that emits light of a blue-based color.

31. The OLED display device of claim 30, wherein the selective light absorbing layer of the third light absorbing area is a color filter having a cyan-based color.

32. The OLED display device of claim 19, further comprising a color purity enhancing layer formed on the major surface of the second substrate main body, the color purilty enhancing layer facing toward the pixel area.

33. The OLED display device of claim 32, wherein the color purity enhancing layer is a color filter having the same color of light emitted from the organic light emitting element facing toward the color purity enhancing layer.

34. The OLED display device of claim 33, wherein the selective light absorbing layer is formed of a first color layer and a second color layer stacked with different colors, and the selective light absorbing layer has a color where the color of the first color layer and the color of the second color layer are mixed.

35. The OLED display device of claim 34, wherein the color purity enhancing layer is simultaneously formed with the first color layer of the selective light absorbing layer.

36. An organic light emitting diode (OLED) display device, comprising:
 a first substrate disposed to face to and spaced apart from a second substrate, the first substrate comprising a plurality of pixel areas separated by a plurality of non-pixel areas;
 a plurality of organic light emitting elements formed on a major surface of the first substrate and each of the plurality of organic light emitting elements respectively corresponding to each of the plurality of pixel areas; and
 a selective light absorbing layer formed on a major surface of the second substrate, the selective light absorbing layer including a plurality of areas with each of the plurality of areas corresponding to and facing toward each of the plurality of non-pixel areas, and the each of the plurality of areas of the selective light absorbing layer selectively absorbing light of a color that corresponds to a major color component among color components of external incident light reflected at one of the plurality of organic light emitting elements neighboring one of the plurality of non-pixel areas to which the each of the plurality of areas of the selective light absorbing layer corresponds.

\* \* \* \* \*